United States Patent [19]

van Iseghem et al.

[11] 4,046,608

[45] Sept. 6, 1977

[54] METHOD OF PRODUCING SEMICONDUCTOR COMPONENTS AND PRODUCT THEREOF

[75] Inventors: Paul van Iseghem, Fislisbach; Thomas Vlasak, Birr; Wolfgang Zimmermann, Klingnau, all of Switzerland

[73] Assignee: BBC Brown, Boveri & Company, Limited, Baden, Switzerland

[21] Appl. No.: 628,842

[22] Filed: Nov. 4, 1975

[30] Foreign Application Priority Data

Nov. 4, 1974 Switzerland ............... 14718/74

[51] Int. Cl.² .................................. H01L 21/225
[52] U.S. Cl. ................................ 148/188; 148/186; 148/187; 148/33.5; 357/38; 357/39
[58] Field of Search ............... 148/33.5, 188, 187, 148/186; 357/38, 39

[56] References Cited

U.S. PATENT DOCUMENTS 3,445,735  5/1969  Desmond et al. ............ 148/188 X 3,914,138  10/1975  Rai-Choudhury ............ 148/186

FOREIGN PATENT DOCUMENTS 1,816,082  6/1970  Germany ............ 148/188
1,816,084  6/1970  Germany ............ 148/188

*Primary Examiner*—G. Ozaki
*Attorney, Agent, or Firm*—Oblon, Fisher, Spivak, McClelland & Maier

[57] ABSTRACT

Semiconductor components containing at least one junction and at least one weakly N- or P-conducting zone containing from $10^{13}$ to $2.5 \times 10^{14}$ doping atoms/cm³ are prepared by diffusing dopant atoms at elevated temperatures into appropriate zones of a semiconductor crystal from a nickel film containing the dopant deposited on the surface of the crystal and then cooling the in-diffused semiconductor crystal to room temperature at a rate sufficient such that the specific resistance of the weakly doped zone is not changed by the nickel atoms which diffuse into the semiconductor crystal along with the doping atom.

9 Claims, 3 Drawing Figures

METHOD OF PRODUCING SEMICONDUCTOR COMPONENTS AND PRODUCT THEREOF

BACKGROUND OF THE INVENTION

1. Field of the Invention

The present invention relates to a method of producing semiconductor components with at least one junction and at least one weak N- or P-conducting zone containing $10^{13}$ to $2.5 \times 10^{14}$ doping atoms/cm$^3$. More particularly, the present invention relates to the doping of semiconductor substrates having the above-described characteristics by diffusing appropriate doping atoms into individual zones in the substrate from a layer of nickel containing an appropriate doping material and deposited on one of the semiconductor crystal surfaces.

2. Description of the Prior Art

A prior art method of doping semiconductor substrates with an appropriate dopant material is known in which a nickel film containing the desired dopant is deposited on the semiconductor body on the electroless autocatalytic reduction of a nickel salt with a boron compound in the same solution. The method is described in German Pat. No. 2,144,018. The semiconductor substrate covered with the doped nickel layer is then subjected to inward diffusion of the boron contained therein at temperatures between 800° and 1400° C.

In another technique, an N-doped zone is provided in a semiconductor substrate as disclosed in German Pat. No. 1,816,082 by chemically depositing a phosphorous containing nickel film of the substrate and then heat-treating the substrate. One particular advantage of this process is that the nickel layer which functions as the diffusion source can be deposited electrolessly at low temperature, thereby eliminating the evaporation step which requires a large amount of power. However, up to the present time, no successful method has been known in which this technology can be used for the fabrication of semiconductor devices having voltage capacities above 2500 V. These devices normally require correspondingly thicker and deeper-ohmic semiconductor wafers.

A need, therefore, continues to exist for a technique of forming semiconductor devices having voltage characteristics above 2500 V in which the dopant atoms are diffused from a covering nickel film.

SUMMARY OF THE INVENTION

Accordingly, one object of the present invention is to provide a method of fabricating semiconductor devices in which deposition of dopant species by evaporation techniques is eliminated.

Another object of the present invention is to provide a method of fabricating semiconductor devices having voltage characteristics in excess of 2500 V by the in-diffusion of dopant atoms from a covering nickel film.

Briefly, these objects and other objects of the present invention as hereinafter will become more readily apparent can be attained by a process for preparing semiconductor components containing at least one junction and at least one weakly N- or P-conducting zone containing from $10^{13}$ to $2.5 \times 10^{14}$ doping atoms/cm$^3$ by diffusing dopant atoms at elevated temperatures into appropriate zones of a semiconductor crystal from a nickel film containing the dopant deposited on the surface of the crystal and then cooling the in-diffused semiconductor crystal to room temperature at a rate sufficient such that the specific resistance of the weakly doped zone is not changed by the nickel atoms which diffuse into the semiconductor crystal along with the doping atoms.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
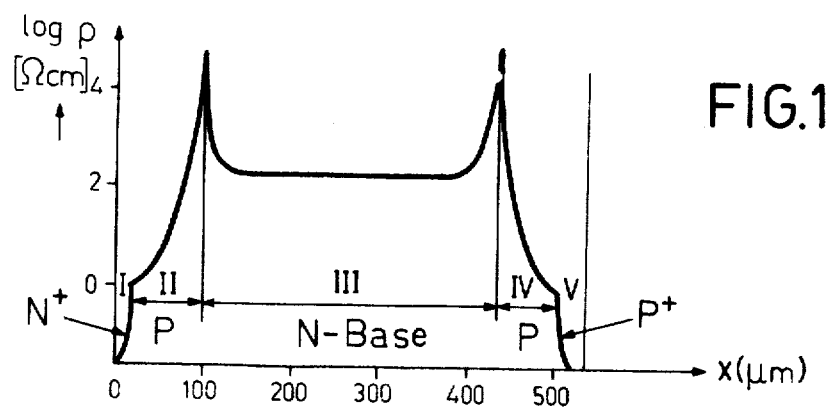
FIG. 1 shows schematically the resistance profile of a thyristor in which the N$^+$-emitter diffusion was achieved from a phosphorous-containing nickel film.

In the process of the present invention, semiconductor devices having voltage characteristics greater than 2500 V are prepared by the indiffusion of dopant materials from nickel films which cover appropriate sections of the semiconductor substrate. The heart of the present invention is that after the inward diffusion of the doping material present in the nickel film, the semiconductor crystal is cooled in such a way that after cooling to room temperature, the specific resistance of the weakly doped zone is not changed by the nickel atoms which also diffuse into the semiconductor crystal during the inward diffusion of the doping material. After the step of in-diffusing the dopant material from the nickel layer, the semiconductor crystal is cooled in a manner which conforms to the expression: $A/h^2 > (0.15 \pm 0.05)$, wherein $A = 16.6 \int_0^t \exp\{-2.381 \text{ eV}/kI(t)\}dt$; wherein T is the temperature in °K during the cooling as a function of time, $t$ is the time in seconds during the cooling process, $h$ is the thickness of the semiconductor crystal in cm, and $k$ is the Boltzman constant = $8.614 \times 10^{-5}$ eV° K$^{-1}$.

In the cooling process it has been proven to be especially advantageous to cool the semiconductor crystal at a constant rate $\Delta T/\Delta t$, stepwise, or at a constant rate interrupted by temperature holding steps, that is, starting from the temperature $T_{E_1}$ at which the doping material in the nickel film is diffused into the semiconductor crystal (inward diffusion temperature), the crystal is cooled at a first rate to a first holding temperature $T_{H_1}$. Thereafter, the crystal is tempered at this temperature and subsequently further cooled whereby the continued cooling of the crystal can be interruped by temperature holding step: $T_{H_2} \ldots T_{H_n}$ until the crystal is cooled to room temperature.

Usually the diffusion of nickel from the nickel film over the disturbed areas of the silicon semi-conductor is accomplished at a temperature of about 1100° C or greater. The maximum diffusion temperature is dependent upon the melting temperature of the silicon. The temperature of in-diffusion can be less than 1100° C. Since the time of diffusion decreases or temperature increases, the highest possible temperature should be selected.

The layer of nickel deposited over the semi-conductor device is generally between 0.05 and 2μ thick. The loading of the nickel film and the addition of donors and acceptors into the nickel film are well known procedures as described in West German Pat. No. 2,144,018.

In an especially preferred embodiment, the doping material is diffused into the crystal at a temperature $T_E \geq 1100°$ C. Thereafter, the semi-conductor crystal is cooled at a rate $\Delta T/\Delta t \geq 5°$ C/min to a holding temperature $T_H \geq 900°$ C, wherein $T_E - T_H$ should be $\geq 50°$ C. The crystal is then tempered at the holding temperature $T_H$ for at least 6 hours and thereafter cooled to room temperature. The latter cooling rate to room temperature is unimportant.

For a complete understanding of the invention, reference is hereby made to FIG. 1 which shows the resistance profile of a thyristor in which the specific resistance log $\rho$ in $\Omega$ cm is plotted as a function of the depth $\chi$ in $\mu$m. Here, I denotes the N+-emitter zone, II the P-base region (or control zone), III the N-base region and IV and V the anode-side P-base and P+-emitter zones, respectively. The starting material is an N-conducting silicon wafer with a thickness $h$ of 550 $\mu$m and a basic doping of $5 \times 10^{13}$ atoms/cm$^3$. The dopant material for the N conducting base is phosphorous although other conventional N base dopants can be used. Also, the N base can be formed by the neutron irradiation of the base. Aluminum is applied to the surface of the silicon wafer and then is heated to a temperature of about 1260° C for a 24 hour diffusion time to produce the P-zones II and V. Aluminum is diffused into the silicon wafer by this process. Between the two layers there is still an N-conducting layer (N-base) with a thickness of about 350 $\mu$m. Next comes the diffusion of the N+- and P+-emitter zones I and V, respectively, from a phosphorus or boron containing nickel film deposited chemically on the silicon wafer before the diffusion. The temperature for the diffusion process is about 1270° C and for a duration of about one-half hour. After the inward diffusion of the emitter zones II and V, the silicon wafer is cooled at a rate of 2° C/min. As the resistance profile taken by means of "spreading resistance" shows (FIG. 1), the concentration of the nickel impurities in the silicon wafer is so small that no influence of these impurities on the doping profile of the thyristor can be detected. Spreading resistance is a method of determining the resistance of semi-conductor substances as described by R. G. Magur and D. H. Dicket, J. Chem. Soc., 113, 255 (1966). The resistance profiles of the devices of FIGS. 1-3 were determined by this method.

In the production of the doping profiles shown in the following FIGS. 2 and 3, the same diffusion processes were used as for that shown in FIG. 1. In these cases, however, the semi-conductor plates were thicker. The two P zones, for instance, can be made by using the paint-on method or by using the steam diffusion method. The N+ and P+ zones are obtained by the addition of the nickel films to the disturbed areas concerned, and then heated. The Ni atoms which diffuse into the crystals act as acceptors and thus result in a decrease of the charge carrier concentration of the N base.

Figure 2:
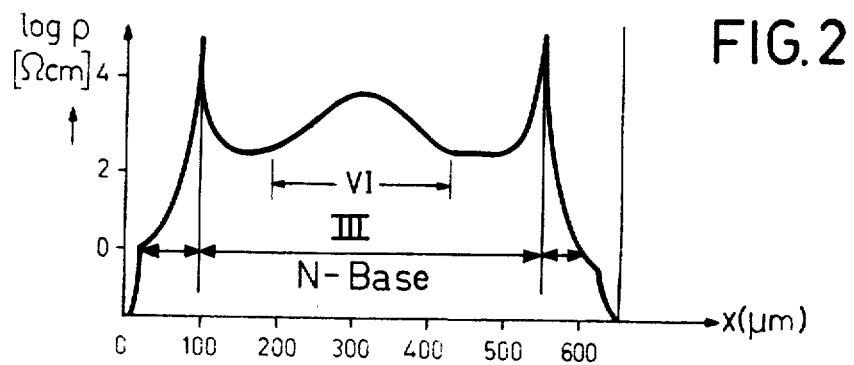
FIGS. 2 and 3 show schematically two more resistance profiles of thyristors with thicker and higher resistance N-based than that of the thyristor of FIG. 1.

FIG. 2 shows the resistance profile of a thyristor made from a 650 $\mu$m thick silicon wafer with a basic doping of $3.8 \times 10^{13}$ atoms/cm$^3$ and an N-base thickness of 450 $\mu$m. The fabrication technique is like that for the thyristor described above in connection with FIG. 1. As the spreading resistance measurement shows, the N-base now exhibits an additional region VI in which the specific resistance log $\rho$ has a maximum. A cooling rate of 2° C/min therefore does not suffice to diffuse out the active nickel, which obviously causes a partial compensation of the N-conducting base zone, completely from the N-base.

While the blocking voltage of the thyristor with the doping profile of FIG. 1 is about 2500 V, thyristors with the doping profile of FIG. 2 have blocking voltages of only 600 V maximum, although the basic doping of the latter thyristor is weaker (with, at the same time, a thicker N-base) than that of the component of FIG. 1, which should lead to higher blocking voltages (cf. e.g.: German Pat. No. 1,250,561). The reason for this is that the blocking layers of the two outer PN-junctions spread with increasing inverse voltage much faster into the high ohmic region VI than into the low resistance region of the N-base (III-VI), so that the punch-through effect sets in even at low inverse voltages.

Figure 3:
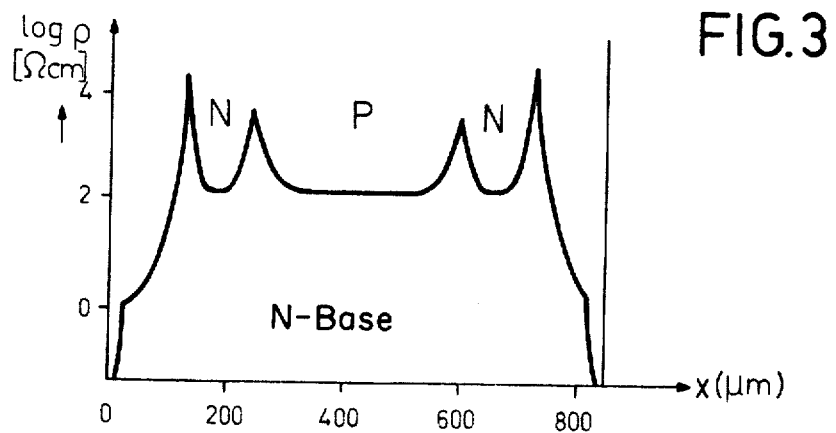

FIG. 3 shows that by the use of an even thicker base (about 800 $\mu$m) as proves to be necessary for example, in the production of high-voltage thyristors (as well as triacs and avalanche diodes), and a cooling rate of 2° C/min, there occurs even an overcompensation in the N-base, i.e., the N-base no longer exhibits a uniform N-conducting region but has a P-conducting middle zone. The invention is based on the following knowledge and considerations:

The diffusion of nickel occurs in silicon crystals by the "dissociative diffusion mechanism", i.e., it proceeds quickly across spaces between lattice points and slowly across lattice points. Only nickel at lattice points with two acceptor levels and presenting an effective recombination center, is electrically active. The total proportions of electrically active nickel incorporated amounts to about 0.1%. The solubility limit of nickel in typical semiconductors like germanium and silicon is about $10^{17} - 10^{18}$ atoms/cm$^3$, which corresponds to a solubility limit for the electrically active nickel of about $10^{14} - 10^{15}$ atoms/cm$^3$. This concentration is of the same order of magnitude as the base doping of the semiconductor component. Inward diffused nickel can thus exert a great influence on the electrical properties of the N-base zone of a component.

To produce high blocking voltage semiconductor components, in which the diffusion of the doping material occurs from a nickel film containing the appropriate doping substance deposited on the semiconductor surface, there must therefore be avoided any compensation by electrically active nickel in the weakly doped zones of the semiconductor crystal, e.g., in the N-base of semiconductor components like thyristors, triacs, avalanche diodes and the like. This is achieved by the outward diffusion of the electrically active nickel through sufficiently slow cooling and, indeed, the temperature curve T(t) during cooling must be chosen, for a semiconductor crystal of thickness $h$ with weakly doped zones having a concentration of $\leq 2.5 \times 10^{14}$ doping atoms/cm$^3$, in such a way that the quotient of the integral:

$$A = \int_o^t 16.6 \exp\{-2.381 \text{ eV}/kT(t')\} dt'$$

and the square of the thickness $h$ is greater than (0.15 $\pm$ 0.05), where the maximum cooling rate should be less than 5° C/min. Here $k$ is the Boltzman constant, T the temperature in °K and $t$, $t'$ the time. If for example, an inward diffusion temperature $T_E = 1250°$ C is chosen [i.e., for a linear cooling curve: $T(t') = 1523 -$ ($\Delta T/\Delta t)t'$], there results with an $A/h^2 \geq 0.2$ for different thicknesses of the semiconductor element the values for the corresponding cooling rates ($\Delta T/\Delta t$) given in the Table.

TABLE

| At a maximum thickness of: | A cooling rate of at most: |
|---|---|
| 811 μm | ≦ 1° C/min |
| 575 μm | ≦ 2° C/min |
| 467 μm | ≦ 3° C/min |
| 407 μm | ≦ 4° C/min |

It is not essential for the process of the invention that the cooling rate be constant. For example, it is also possible to cool to a holding temperature $T_{H_1}$, to temper the semiconductor crystal at this temperature for some time and then to cool it to room temperature by any necessary additional stages (holding temperatures). If, for example, after the inward diffusion of the doping substance at 1250° C, the semiconductor crystal is cooled at a rate of 2° C/min to a holding temperature of 1100° C, tempered at this temperature for 5.3 hours and finally cooled further to room temperature at a rate of 2° C/min, then the condition $A/h^2 \geq 0.2$ is likewise satisfied and therefore practically all nickel impurity is diffused out.

Since at cooling rates >5° C/min there is elimination of active nickel in the interior of the silicon crystal depending on the existing temperature - but not on the thickness of the crystal, the active nickel can also be removed by fast cooling and subsequent tempering. It has proved to be particularly advantageous for semiconductor crystals with the inward diffusion temperature $T_E \geq 1100°$ C to be cooled rapidly to a holding temperature $T_H \geq 900°$ C, where $T_E - T_H$ should be $\approx$ 50° C, then to be tempered for at least 7 hours and finally to be cooled to room temperature.

Having now fully described this invention, it will be apparent to one of ordinary skill in the art that many changes and modifications can be made thereto without departing from the spirit or scope of the invention as set forth herein.

What is claimed as new and intended to be covered by Letters Patent is:

1. In a method for producing semiconductor components with at least one junction and at least weakly N- or P-conducting zone containing from $10^{13}$ to $2.5 \times 10^{14}$ doping atoms/cm$^3$ and formed by diffusing the dopant atoms at elevated temperatures into appropriate zones of a semiconductor crystal from a nickel film containing said dopant deposited on the surface of said crystal, the improvement comprising:
    cooling said in-diffused semiconductor crystal to room temperature at a rate of
    $A/h^2 > (0.15 \pm 0.05)$, wherein
    $A = 16.6 \int_0^{t'} \exp(-2.381 \text{ eV}/kT(t')) dt'$,
    T = temperature in °K as a function of the time during cooling,
    t = time in seconds during cooling,
    h = thickness of the semiconductor crystal in cm, and
    k = Boltzman constant = $8.614 \times 10^{-5}$ eV°K$^{-1}$
    sufficient such that the specific resistance of said weakly doped zone is not changed by the nickel atoms which diffuse into the semiconductor crystal along with said doping atoms, thereby forming a semiconductor component having a voltage capacity greater than 2.5 kV.

2. The product produced by the process of claim 1.

3. The method of claim 1, wherein said doping atoms are diffused from said deposited nickel layer at a temperature $T_E$ between 1100° and 1400° C.

4. The method of claim 3, wherein the temperature variation T(t) during cooling is chosen so that the relation between the temperature T and the time t is T(t) = $T_E - (\Delta T/\Delta t)t$, where the cooling rate $\Delta T/\Delta t$ is approximately constant and smaller than 5° C/min.

5. The method of claim 3, wherein after the in-diffusion of said doping atoms at temperature $T_E$, said semiconductor crystal is cooled at a first cooling rate to a first holding temperature $T_{H_1}$ at which holding temperature said crystal is tempered, and thereafter said partially cooled crystal is cooled to room temperature, wherein the further cooling of said crystal can be interrupted by holding stages defined by the stages $T_{H_2} \ldots T_{H_n}$.

6. The method of claim 5, wherein the cooling rate between $T_E$ and $T_{H_1}$ as well as the cooling rate between subsequent holding temperatures $T_{H_2}, T_{H_3} \ldots T_{H_n}$ is controlled to be less than 5° C/min.

7. The method of claim 1, wherein after said doping atoms are in-diffused into said crystal at the temperature $T_E$, said crystal is cooled to a first holding temperature $T_H$ at a cooling rate $\Delta T/\Delta t > 5°$ C/min where said crystal is tempered, and thereafter cooling said tempered crystal to room temperature.

8. The method of claim 1, wherein said temperature $T_E$ is greater than or equal to 1100° C, said temperature $T_H$ is greater than or equal to 900° C, $T_E - T_H \geq 50°$ C and said tempering is conducted for at least 7 hours.

9. The method of claim 1, wherein said nickel film is 0.005 to 2 μ thick.

* * * * *